United States Patent
Wu et al.

(10) Patent No.: US 9,009,032 B2
(45) Date of Patent: Apr. 14, 2015

(54) METHOD AND SYSTEM FOR PERFORMING SAMPLE RATE CONVERSION

(75) Inventors: David Wu, San Diego, CA (US); Keith Klinger, Poway, CA (US)

(73) Assignee: Broadcom Corporation, Irvine, CA (US)

( * ) Notice: Subject to any disclaimer, the term of this patent is extended or adjusted under 35 U.S.C. 154(b) by 1493 days.

(21) Appl. No.: 11/558,168

(22) Filed: Nov. 9, 2006

(65) Prior Publication Data

US 2008/0114605 A1    May 15, 2008

(51) Int. Cl.
| | | |
|---|---|---|
| G10L 11/00 | (2006.01) |
| G10L 19/00 | (2013.01) |
| G10L 21/00 | (2013.01) |
| H03H 17/06 | (2006.01) |
| G11B 20/00 | (2006.01) |
| G11B 20/10 | (2006.01) |

(52) U.S. Cl.
CPC ..... *H03H 17/0621* (2013.01); *G11B 20/00007* (2013.01); *G11B 20/10037* (2013.01); *G11B 20/10527* (2013.01); *G11B 2020/00014* (2013.01); *G11B 2020/10592* (2013.01); *G11B 2020/10981* (2013.01); *G11B 2220/2541* (2013.01); *G11B 2220/2579* (2013.01); *H03H 2218/06* (2013.01)

(58) Field of Classification Search
USPC ......... 704/270, 278, 211, 500–504, 200, 201, 704/212; 700/94; 381/21
See application file for complete search history.

(56) References Cited

U.S. PATENT DOCUMENTS

| | | | | |
|---|---|---|---|---|
| 5,928,342 | A * | 7/1999 | Rossum et al. | 710/74 |
| 5,946,352 | A * | 8/1999 | Rowlands et al. | 375/242 |
| 6,128,597 | A * | 10/2000 | Kolluru et al. | 704/500 |
| 6,208,671 | B1 * | 3/2001 | Paulos et al. | 370/545 |
| 6,362,755 | B1 * | 3/2002 | Tinker | 341/61 |
| 6,430,533 | B1 * | 8/2002 | Kolluru et al. | 704/500 |
| 6,629,078 | B1 * | 9/2003 | Grill et al. | 704/500 |
| 7,010,370 | B1 * | 3/2006 | Riegelsberger | 700/94 |
| 7,039,477 | B1 * | 5/2006 | Kamiya et al. | 700/94 |
| 7,262,716 | B2 * | 8/2007 | Yu et al. | 341/61 |
| 7,406,409 | B2 * | 7/2008 | Otsuka et al. | 704/211 |
| 7,689,305 | B2 * | 3/2010 | Kreifeldt et al. | 700/94 |
| 8,280,743 | B2 * | 10/2012 | Seefeldt et al. | 704/500 |
| 8,849,433 | B2 * | 9/2014 | Seefeldt et al. | 700/94 |
| 2002/0049581 | A1 * | 4/2002 | Liu | 704/200 |
| 2002/0193894 | A1 * | 12/2002 | Terada et al. | 700/94 |
| 2003/0196078 | A1 * | 10/2003 | Wise et al. | 712/300 |

(Continued)

OTHER PUBLICATIONS

I. Kuroda and T. Nishitani, "Asynchronous Multirate System Design for Programmable DSPs," ICASSP, vol. 5, San Francisco, CA, IEEE, 1992, p. 549-552.*

*Primary Examiner* — Edgar Guerra-Erazo
(74) *Attorney, Agent, or Firm* — Foley & Lardner LLP

(57) ABSTRACT

A method and system for performing sample rate conversion is provided. The method may include configuring a system to convert a sample rate of a first audio channel of a plurality of audio channels to produce a first audio stream of samples. The system may be dynamically reconfigured to convert a sample rate of a second of the plurality of audio channels to produce a second audio stream of samples, wherein the first and second audio streams are output from the system at the same time. The method may further include arbitrating between request for additional data from the first and second audio stream of samples, where processing of the first channel is suspended when the request corresponds to a second channel that is of higher priority.

27 Claims, 8 Drawing Sheets

(56) References Cited

U.S. PATENT DOCUMENTS

| | | | |
|---|---|---|---|
| 2003/0227969 A1* | 12/2003 | Wise et al. | 375/240.1 |
| 2005/0271214 A1* | 12/2005 | Kim | 381/17 |
| 2006/0093152 A1* | 5/2006 | Thompson et al. | 381/17 |
| 2006/0115090 A1* | 6/2006 | Kirkeby | 381/17 |
| 2006/0168114 A1* | 7/2006 | Glatron et al. | 709/218 |
| 2006/0173691 A1* | 8/2006 | Mukaide | 704/500 |
| 2008/0229911 A1* | 9/2008 | Kamath et al. | 84/603 |

* cited by examiner

METHOD AND SYSTEM FOR PERFORMING SAMPLE RATE CONVERSION

CROSS-REFERENCE TO RELATED APPLICATIONS/INCORPORATION BY REFERENCE

This patent application makes reference to:
U.S. application Ser. No. 11/558,145 filed on even date herewith; and
U.S. application Ser. No. 11/558,191 filed on even date herewith; and
U.S. application Ser. No. 11/558,229 filed on even date herewith.

Each of the above stated applications is hereby incorporated herein by reference in its entirety.

FIELD OF THE INVENTION

Certain embodiments of the invention relate to audio signal processing. More specifically, certain embodiments of the invention relate to a method and system for performing sample rate conversion.

BACKGROUND OF THE INVENTION

With the development of optical disk technology, larger amounts of audio and/or video data may be stored in a single disk when compared to other technologies such as magnetic recording, for example. Recent developments continue to expand the capabilities of optical disks by enabling higher data storage capacity within a single disk. For example, Blu-ray optical disk technology may utilize blue lasers to read and write to the disc. A Blu-ray disc may store substantially more data than, for example, a digital versatile disk (DVD) or a compact disk (CD), because of the shorter wavelength, approximately 405 nm, of the blue laser compared to the 650 nm wavelength for red lasers used by DVDs and the 780 nm wavelength for infrared lasers used by CDs. The use of shorter wavelengths enables more information to be stored digitally in the same amount of space. In comparison to high-definition digital versatile disk (HD-DVD), which also uses a blue laser, Blu-ray technology may enable more information capacity per optical disk layer.

For Blue-ray applications, coders/decoders (codecs) may be utilized to compress and/or decompress audio and video information to be stored and/or retrieved from optical discs. For video applications, standalone Blu-ray players may be able to decode various codec formats, such as, MPEG-2, which is also used for DVDs, H.264/AVC, a newer codec developed jointly by ISO/IEC's MPEG and ITU-T's VCEG, and/or VC-1, a codec based on Microsoft's Windows Media 9. For audio applications, Blu-ray players may support Dolby Digital, digital theater system (DTS), and linear pulse code modulation (PCM), up to 7.1 channels, for example. Blu-ray players may also support Dolby Digital Plus and lossless formats such as Dolby TrueHD and DTS HD, for example. In some instances, the Blu-ray player may need to support the linear PCM 5.1, Dolby Digital 5.1 and DTS 5.1 bitstream formats as one of them may be used as the sole soundtrack on a disc. For lossless audio in movies in the PCM, Dolby TrueHD or DTS-HD formats, Blu-ray discs may support encoding of up to 24-bit/192 kHz for up to six channels or up to 24-bit/96 kHz for up to eight channels.

In HD-DVD audio applications, up to 7.1 channels of surround sound may be mastered using the linear (uncompressed) PCM, Dolby Digital, and DTS formats also used on DVDs. Moreover, HD-DVD players may also support Dolby Digital Plus and lossless formats such as Dolby TrueHD and DTS HD, for example. On HD-DVD applications, the Dolby formats such as Dolby Digital or Dolby Digital Plus track, for example, may be used as the sole soundtrack on a disc. For lossless audio in movies in the PCM, Dolby TrueHD or DTS-HD formats, HD-DVD discs may support encoding of up to 24-bit/192 kHz for two channels or of up to 24-bit/96 kHz encoding for eight channels.

Coding and/or decoding systems that provide sufficient architectural flexibility and efficiency to support the requirements of new optical storage technologies, such as Blue-ray and/or HD-DVD, for example, may be necessary for the design and implementation of cost-effective consumer products. Furthermore, a system for converting the sample rate of the various audio formats to, for example, a common sample rate may be necessary so that the complexity of subsequent systems may be reduced. This may also be necessary so that various audio formats may be combined.

Further limitations and disadvantages of conventional and traditional approaches will become apparent to one of skill in the art, through comparison of such systems with some aspects of the present invention as set forth in the remainder of the present application with reference to the drawings.

BRIEF SUMMARY OF THE INVENTION

A system and/or method is provided for performing sample rate conversion, substantially as shown in and/or described in connection with at least one of the figures, as set forth more completely in the claims.

These and other advantages, aspects and novel features of the present invention, as well as details of an illustrated embodiment thereof, will be more fully understood from the following description and drawings.

DETAILED DESCRIPTION OF THE INVENTION

Certain embodiments of the invention may be found in a method and system for performing sample rate conversion. Exemplary aspects of the invention may comprise configuring a system to convert a sample rate of a first of a plurality of audio channels to produce a first audio stream of samples. The system may be dynamically reconfigured to convert a sample rate of a second audio channel of said plurality of audio channels to produce a second audio stream of samples. The first and second audio streams may be output from the system at the same time. The method may further include arbitrating between requests for additional data from the first and second audio stream of samples, where processing of the first channel may be suspended when the request corresponds to a second channel that may be of higher priority.

Figure 1A:
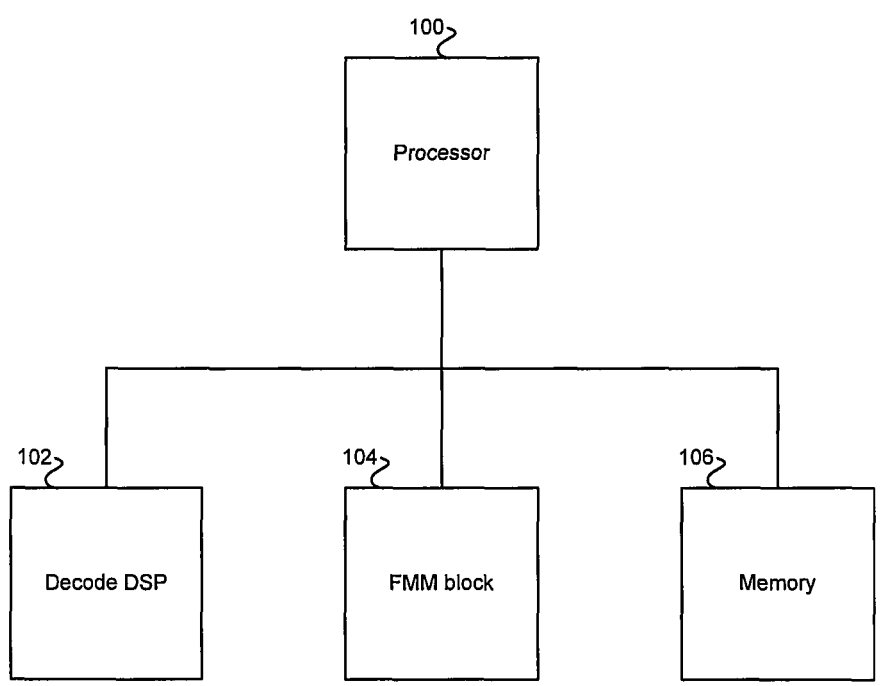
FIG. 1A is a block diagram illustrating an exemplary audio decoding system for Blu-ray and/or high-definition DVD, in accordance with an embodiment of the invention.

FIG. 1A is a block diagram illustrating an exemplary audio decoding system for Blu-ray and/or high-definition DVD, in accordance with an embodiment of the invention. Referring to FIG. 1A, there is shown a system for audio decoding that may comprise a processor 100, a decode digital signal processor (DSP) 102, a flexible audio mixing and muxing (FMM) block 194, and a memory 106. The processor 100 may comprise suitable, logic, circuitry and/or code that may enable control and/or management of operations performed by the decode DSP 102, the FMM block 104, and/or the memory 106. The decode DSP 102 may comprise suitable logic, circuitry, and/or code that may enable decoding of audio information. In this regard, the audio information may be comprised within PCM frames, for example. The output of the decode DSP 102 may be communicated to the FMM block 104. The memory 106 may comprise suitable logic, circuitry, and/or code that may enable storage of data processed by the decode DSP 102 and/or the FMM block 104.

The FMM block 104 may comprise suitable, logic, circuitry and/or code that may enable playback and channel mixing for Blu-ray and/or high-definition DVD (HD-DVD) operations, for example. In this regard, the FMM block 104 may enable playback and channel mixing of up to 7.1 channels primary audio, 5.1 channel secondary audio, and/or 8 channel of mono sound effects at 96 KHz. The FMM block 104 may enable playback and channel mixing stereo primary audio, stereo secondary audio, and/or stereo or two mono sound effects at 192 KHz, for example. The FMM block 104 may also enable 5.1 channels AC-3 or digital theater system (DTS) encoding for compressed Sony/Philips digital interface (SPDIF), where AC-3 refers to the 5.1-channel sound system specified in the digital-HDTV standard and also known as Dolby Digital.

The FMM block 104 may enable various stages of mixing, for example. A first mixing stage may enable mixing of 7.1 channels primary audio, 5.1 channel secondary audio, and 8 mono stereo channels sound effects. Another mixing stage may enable down-mixing the output of the first mixing stage. In this regard, the FMM block 104 may provide dynamic update of mixing coefficients, synchronization at frame boundary, mixing coefficient smoothing or ramping, and soft limiting for channel mixing.

The FMM block 104 may also enable high-quality sample rate conversion (SRC) by increasing the effective sample rate of the audio input samples by either up-conversion or down-conversion. For example, the FMM may up-convert or increase the number of samples at, for example, the rate of 1:4 or 1:2. Alternatively, the FMM may down-convert or decrease the number of samples at, for example, the ratio 4:1 or 2:1. The FMM may also convert the number of samples by a non-integer conversion ratio such as, 1.1:2, by linear interpolation. The FMM may be capable of converting the sample rate of more than one channel simultaneously. For example, one channel may be up-converted while another may be down-converted. The FMM block 104 may also support delay balance between compressed SPDIF, digital-to-analog conversion (DAC) and inter-IC sound (I2S) outputs, for example. Moreover, the FMM block 104 may also support audio watermark detection, Dolby bass management, and DTS speaker management, for example. Moreover, the FMM block 104 may also support various post processing functions.

Figure 1B:
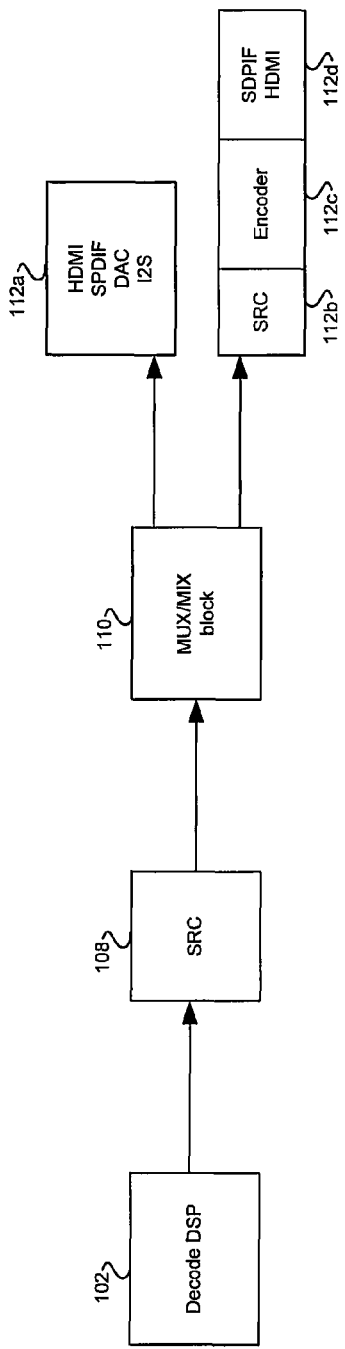
FIG. 1B is a block diagram illustrating an exemplary sequential FMM topology, in accordance with an embodiment of the invention.

FIG. 1B is a block diagram illustrating an exemplary sequential FMM topology, in accordance with an embodiment of the invention. Referring to FIG. 1B, there is shown a sequential architecture or topology for a system that enables playback and channel mixing, wherein the system may comprise an sample rate converter (SRC) 108, a muxing and mixing (MUX/MIX) block 110, an HDMI/SPDIF/DAC/I2S block 112a, an SRC 112b, an encoder 112c, and an SPDIF/HDMI block 112d. The system may also comprise a decode DSP, such as the decode DSP 102 disclosed in FIG. 1A.

The SRC 108 may comprise suitable logic, circuitry, and/or code that may enable sample rate conversion of data provided by the decode DSP 102. For example, the SRC 108 may up-convert or increase the number of samples at, for example, the rate of 1:4 or 1:2. Alternatively, the SRC 108 may down-convert or decrease the number of samples at, for example, the ratio 4:1 or 2:1. The SRC 108 may also convert the number of samples by a non-integer conversion ratio such as, 1.1:2, by linear interpolation. The SRC 108 may be capable of converting the sample rate of more than one channel simultaneously. For example, one channel may be up-converted while another may be down-converted. The MUX/MIX block 110 may comprise suitable logic, circuitry, and/or code that may enable mixing and/or of multiplexing data provided by the SRC 108. The MUX/MIX block 110 may communicate the processed data to the HDMI/SPDIF/DAC/I2S block 112a and/or to the SRC 112b, for example.

The HDMI/SPDIF/DAC/I2S block 112a may comprise suitable logic, circuitry, and/or code that may enable processing of data in at least one of a plurality of formats such as high definition multimedia interface (HDMI), SPDIF, DAC, and/or I2S, for example. The SRC 112b may comprise suitable logic, circuitry, and/or code that may enable sample rate conversion of data provided by the MUX/MIX block 110. The SRC 112b may accomplish this in the manner described above. The encoder 112c may comprise suitable logic, circuitry, and/or code that may enable encoding of the sample rate converted data from the SRC 112b. The SPDIF/HDMI block 112d may comprise suitable logic, circuitry, and/or code that may enable processing of the encoded data generated by the encoder 112c in at least one of a plurality of formats such as high definition multimedia interface (HDMI) and SPDIF, for example.

Communication from the decode DSP 102 to the SRC 108 and from the SRC 108 to the MUX/MIX block 110 may occur via a plurality of channels such as 22 channels, for example. Communication from the MUX/MIX block 110 to the HDMI/SPDIF/DAC/I2S block 112a may occur via 14 channels and to the SRC 112b may occur via 8 channels, for example.

The sequential topology disclosed in FIG. 1B may utilize a single path with down-mixing, decoding output, and encoding output in a serial pipeline scheme. In some instances, while this topology may be less costly by sharing the mixing output, it may also result in a more complex system and/or software design, such as TSM or host PI configuration, for example, due to delay dependency between decoding outputs and encoding inputs. In other instances, an independent topology, such as the one disclosed in FIG. 1C, may be more costly due to separate mixing functions for both decoding output and encoding input, but it may result in a more efficient system and/or software design due to the independent delay between decoding path and encoding path.

Figure 1C:
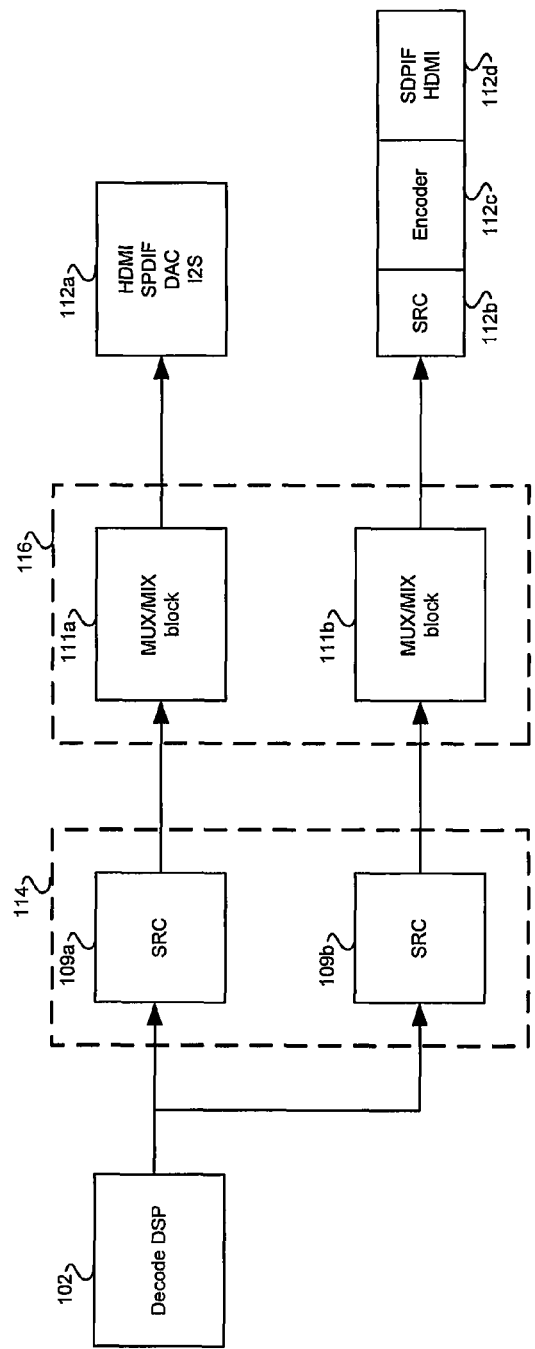
FIG. 1C is a block diagram illustrating an exemplary independent FMM topology, in accordance with an embodiment of the invention.

FIG. 1C is a block diagram illustrating an exemplary independent FMM topology, in accordance with an embodiment of the invention. Referring to FIG. 1C, there is shown an independent architecture or topology for a system that enables playback and channel mixing, wherein the system may comprise an SRC 114 and a MUX/MIX block 116. The system may also comprise the HDMI/SPDIF/DAC/I2S block 112*a*, the SRC 112*b*, the encoder 112*c*, the SPDIF/HDMI block 112*d*, and the decode DSP 102 disclosed in FIG. 1B. The SRC 114 may comprise a first SRC 109*a* and a second SRC 109*b*. The MUX/MIX block 116 may comprise a first MUX/MIX block 111*a* and a second MUX/MIX block 111*b*.

The SRCs 109*a*, 109*b* may comprise suitable logic, circuitry, and/or code that may enable sample rate conversion of data provided by the decode DSP 102. For example, the SRCs 109*a*, 109*b* may up-convert or increase the number of samples at, for example, the rate of 1:4 or 1:2. Alternatively, the SRC may down-convert or decrease the number of samples at, for example, the ratio 4:1 or 2:1. The SRCs 109*a*, 109*b* may also convert the number of samples by a non-integer conversion ratio such as, 1.1:2, by linear interpolation. The SRCs 109*a*, 109*b* may be capable of converting the sample rate of more than one channel simultaneously. For example, one channel may be up-converted while another may be down-converted.

The MUX/MIX blocks 111*a*, 111*b* may comprise suitable logic, circuitry, and/or code that may enable mixing and/or multiplexing data provided by the SRCs 109*a*, 109*b* respectively. The MUX/MIX blocks 111*a*, 111*b* may communicate the processed data to the HDMI/SPDIF/DAC/I2S block 112*a* and to the SRC 112*b*, respectively. Communication from the decode DSP 102 to the SRCs 109*a*, 109*b* and from the SRCs 109*a*, 109*b* to the MUX/MIX blocks 111*a*, 111*b* may occur via a plurality of channels such as 22 channels, for example. Communication from the MUX/MIX block 111*a* to the HDMI/SPDIF/DAC/I2S block 112*a* may occur via 14 channels and from the MUX/MIX block 111*b* to the SRC 112*b* may occur via 8 channels, for example.

In some instances, post processing functions, such as speaker management (SM) and audio watermark detection, for example, may require that the mixed multi-channels be routed back through to memory ring buffers, such as DRAM buffers, and played back again through a flexible audio mixing and muxing (FMM) processing. In this regard, delay balance between the outputs that result from post processing and those without post processing may be necessary. Since the number of playbacks and captures may be less for a sequential topology when post processing is enabled, both sequential and independent topologies may be utilized for a system that enables playback and channel mixing of audio signals such as those for Blu-ray and/or HD-DVD operations. In some instances, the independent topology may be more suitable when dual decoding and encoding are enabled while the independent topology may be more suitable when dual decoding and post processing of speaker management and audio watermark detection are enabled.

For 48 KHz playback and channel mixing systems, the mixer and multi-channel outputs may operate at the sampling rate of 48 KHz. In this regard, input samples at rates other than 48 KHz may be sample rate converted, mixed and played back at 48 KHz. For 96 KHz playback and channel mixing systems, the mixer and multi-channel outputs may operate at the sampling rate of 96 KHz and input samples at rates other than 96 KHz may be sample rate converted, mixed and played back at 96 KHz. Similarly, for 192 KHz playback and channel mixing systems, the mixer and multi-channel outputs may operate at the sampling rate of 192 KHz and input samples at rates other than 96 KHz may be sample rate converted, mixed and played back at 96 KHz.

Figure 1D:
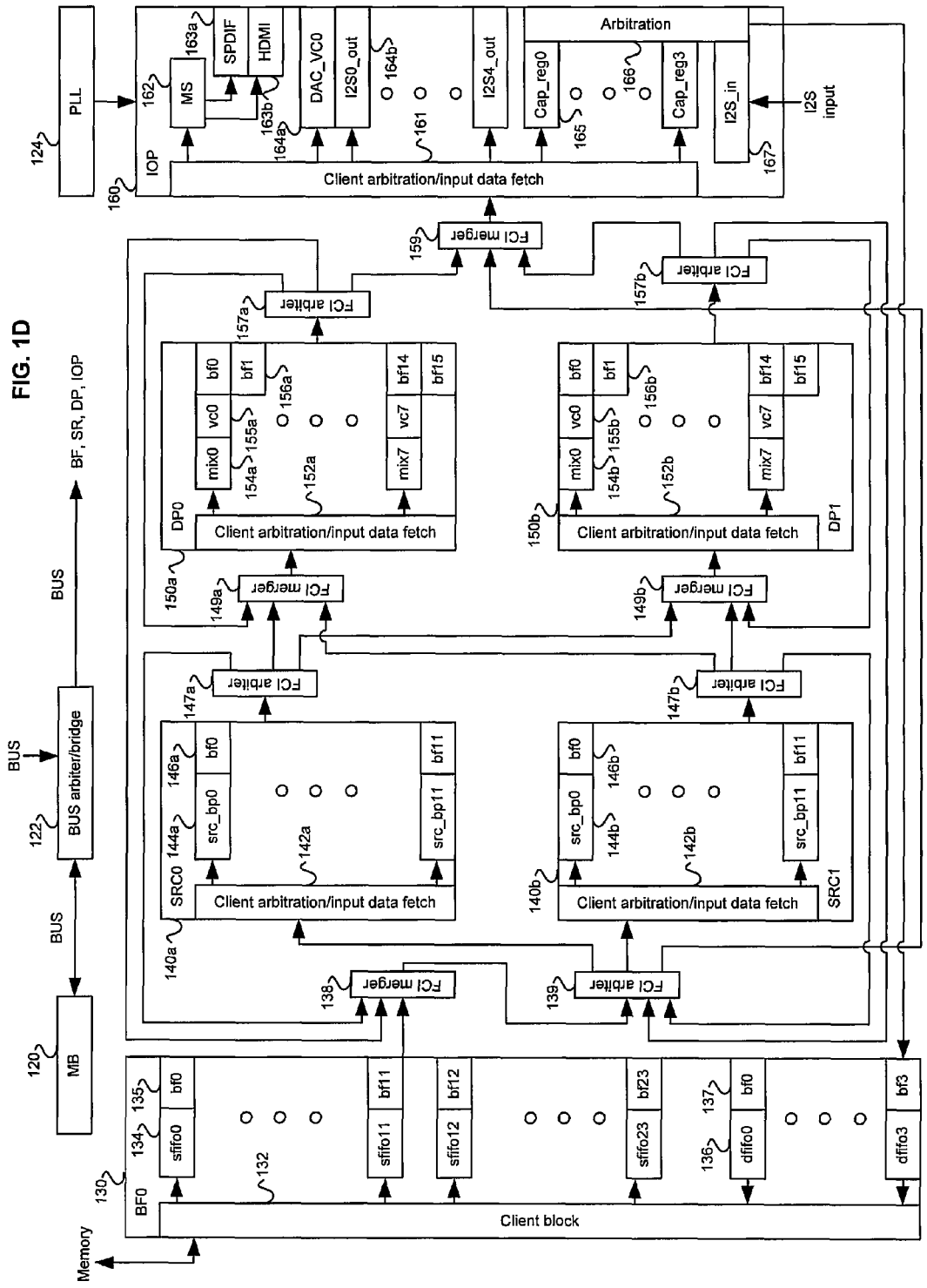
FIG. 1D is a block diagram illustrating an exemplary FMM top-level architecture, in accordance with an embodiment of the invention.

FIG. 1D is a block diagram illustrating an exemplary FMM top-level architecture, in accordance with an embodiment of the invention. Referring to FIG. 1D, there is shown an architectural implementation of the FMM block 104 disclosed in FIG. 1A. The FM block 104 may comprise a metadata block (MB) 120, a BUS arbiter/bridge 122, a buffer block (BF0) 130, a first sample rate converter (SRC) block 140*a*, a second SRC block 140*b*, a first data path (DP) or PCM mixing block (DP0) 150*a*, a second data path block (DP1) 150*b*, an input-output block (IOP) 160, a phase locked loop (PLL) 124, FMM common internal (FCI) interface arbiters 139, 147*a*, 147*b*, 157*a*, and 157*b*, and FCI interface merger blocks 138, 149*a*, 149*b*, and 159.

The exemplary FMM architecture disclosed in FIG. 1B may comprise various types of data flow. One data flow may comprise a decoding data flow from decoding ring buffer to audio playback outputs. Another data flow may comprise an encoding data flow from decoding ring buffer to encoding input ring buffer. The data flows may share the same data pipeline with a data pull model as the flow control. The pipeline stages may include the BF0 130, SRC0 140*a*, SRC1 140*b*, DP0 150*a*, DP1 150*b*, and IOP 160. The data may be rate controlled and/or pulled from the IOP 160. Each of the stages may comprise a single processing unit and multiple small FIFO buffers as the pipeline buffer, for example. Each channel pair may utilize one FIFO buffer. When space is available within a FIFO buffer, the processing unit may process the data to fill the FIFO buffer after the request is granted by the round-robin arbitration among the multiple FIFO buffers.

The MB 120 may comprise suitable logic, circuitry, and/or code that may enable generation of metadata information that may be communicated to other portions of the FM block 104 for processing the audio data. In this regard, the MB 120 may communicate the metadata information, such as a start of frame indicator and/or mixing coefficients, for example, via the BUS arbiter/bridge 122. The MB 120 may communicate metadata information to the BF0 130, the SRC blocks 140*a* and 140*b*, the DP0 150*a* and DP1 150*b*, and/or the IOP 160, for example.

The BF0 130 may comprise a client block 132, a plurality of FIFOs 134 and a plurality of buffers 135. The client block 132 may comprise suitable logic, circuitry, and/or code that may enable communication of data between the FMM 104 and memory, such as the memory 106 in FIG. 1A, for example. In this regard, the memory may be a DRAM memory, for example. The FIFOs 134 may comprise suitable logic, circuitry, and/or code that may enable first-in-first-out data storage operations. The FIFOs 134 may be labeled sfifo0 through sfifo23 for source FIFOs and dfifo0 through dfifo3 for destination FIFOs. The buffers 135 may comprise suitable logic, circuitry, and/or code that may enable data storage. The buffers 135 may be labeled bf0 through bf23 for the buffers associated with the FIFOs sfifo0 through sfifo23 and bf0 through bf3 for the buffers associated with the FIFOs dfifo0 through dfifo3.

The client block 132, the FIFOs sfifo0, sfifo12, and dfifo3, and the buffers bf0, bf12, and bf3 associated with dfifo3, may be shared for encoding and decoding path functions, for example. The FIFOs sfifo1 through sfifo11 and the buffers bf1 through bf11 may be utilized for decoding path functions, for example. The FIFOs sfifo13 through sfifo23 and dfifo0 through dfifo2 and the buffers bf13 through bf23 and bf0 through bf2 associated with the FIFOs dfifo0 through dfifo2 may be utilized for encoding path functions, for example.

The SRC0 140a may comprise a client arbitration/input data fetch block 142a, a plurality of sample rate controllers 144a, and a plurality of buffers 146a. The client arbitration/input data fetch block 142a may comprise suitable logic, circuitry, and/or code that may enable communication of data between the SRC0 140a and the FCI arbiter 139. The sample rate controllers 144a may comprise suitable logic, circuitry, and/or code that may enable adjustment of channel rates. The sample rate controllers 144a may be labeled src_bp0 through src_bp11. The buffers 146a may comprise suitable logic, circuitry, and/or code that may enable data storage. The buffers 146a may be labeled bf0 through bf11. The src_bp0 and bf0 may be shared for encoding and decoding path functions while the src_bp1 through src_bp11 and the bf1 through bf11 may be utilized for decoding path functions.

The SRC1 140b may comprise a client arbitration/input data fetch block 142b, a plurality of sample rate controllers 144b, and a plurality of buffers 146b. The client arbitration/input data fetch block 142b may comprise suitable logic, circuitry, and/or code that may enable communication of data between the SRC1 140b and the FCI arbiter 139. The sample rate controllers 144b may comprise suitable logic, circuitry, and/or code that may enable adjusting channel rates. The sample rate controllers 144b may be labeled src_bp0 through src_bp11. The buffers 146b may comprise suitable logic, circuitry, and/or code that may enable data storage. The buffers 146b may be labeled bf0 through bf11. The src_bp0 and bf0 may be shared for encoding and decoding path functions while the src_bp1 through src_bp11 and the bf1 through bf11 may be utilized for encoding path functions.

The DP0 150a may comprise a client arbitration/input data fetch block 152a, a plurality of mixers 154a, a plurality of volume controllers (VCs) 155a, and a plurality of buffers 156a. The client arbitration/input data fetch block 152a may comprise suitable logic, circuitry, and/or code that may enable communication of data between the DP0 150a and the FCI merger 149a. The mixers 154a may comprise suitable logic, circuitry, and/or code that may enable various audio mixing operations. The mixers 154a may be labeled mix0 through mix7. The volume controllers 155a may comprise suitable logic, circuitry, and/or code that may enable volume control during mixing operations. The volume controllers 155a may be labeled vc0 through vc7. The buffers 156a may comprise suitable logic, circuitry, and/or code that may enable data storage. The buffers 156a may be labeled bf0 through bf15. In this regard, two buffers 156a may be associated with an audio channel, for example. The mix0, vc0, and bf0 may be shared for encoding and decoding path functions while the mix1 through mix7, vc1 through vc7, and the bf2 through bf15 may be utilized for decoding path functions.

The DP1 150b may comprise a client arbitration/input data fetch block 152b, a plurality of mixers 154b, a plurality of volume controllers (VCs) 155b, and a plurality of buffers 156b. The client arbitration/input data fetch block 152b may comprise suitable logic, circuitry, and/or code that may enable communication of data between the DP1 150b and the FCI merger 149b. The mixers 154b may comprise suitable logic, circuitry, and/or code that may enable audio mixing operations. The mixers 154b may be labeled mix0 through mix7. The volume controllers 155b may comprise suitable logic, circuitry, and/or code that may enable volume control during mixing operations. The volume controllers 155b may be labeled vc0 through vc7. The buffers 156a may comprise suitable logic, circuitry, and/or code that may enable data storage. The buffers 156b may be labeled bf0 through bf15. In this regard, two buffers 156b may be associated with an audio channel, for example. The mix0, vc0, and bf0 may be shared for encoding and decoding path functions while the mix1 through mix7, vc1 through vc7, and the bf2 through bf15 may be utilized for encoding path functions.

The DP0 150a and the DP1 150b may be utilized to provide operations such as 16 to 1 channel mixing with an 8-channel pair mixer, dual ping-pong coefficient banks, coefficient smoothing, and/or soft limiting in audio mixer. A feedback loop from the data path (DP) output to the input may allow 7.1 channel PCM from the output of the mixing of primary, secondary and sound effects to be down-mixed further to 5.1 channels for encoding or stereo output, for example.

The IOP 160 may comprise a client arbitration/input data fetch block 161, an MS block 162, an SPDIF block 163a, an HDMI block 163b, a DAC_VC0 block 164a, a plurality of I2S output blocks 164b, a plurality of capture registers 165, an arbitration block 166, and an I2S input block (I2S_in) 167. The plurality of I2S output blocks 164b may be labeled I2S0_out through I2S4_out, for example. The plurality of capture registers 165 may be labeled cap_reg0 through cap_reg3, for example. The client arbitration/input data fetch block 161 may comprise suitable logic, circuitry, and/or code that may enable communication of data between the IOP 160 and the FCI merger 159. The MS block 162 may comprise suitable logic, circuitry, and/or code that may enable data communication between the client arbitration/input data fetch block 161 and the SPDIF block 163a and/or the HDMI block 163b. The SPDIF block 163a may comprise suitable logic, circuitry, and/or code that may enable processing of audio information in accordance with the Sony/Philips digital interface (SPDIF). The HDMI block 163 may comprise suitable logic, circuitry, and/or code that may enable processing audio information in accordance with the high definition multimedia interface (HDMI).

The DAC_VC0 block 164a may comprise suitable logic, circuitry, and/or code that may enable adjusting the volume of the audio signal by performing a digital-to-analog conversion of the audio signal. The plurality of I2S output blocks 164b may comprise suitable logic, circuitry, and/or code that may enable processing audio information in accordance with the I2S interface. The plurality of capture registers 165 may comprise suitable logic, circuitry, and/or code that may enable storage of captured audio information. The arbitration block 166 may comprise suitable logic, circuitry, and/or code that may enable selecting between the plurality of capture registers 165 for providing feedback to the BF0 130 via the destination FIFOs dfifo0 through dfifo3, for example. The I2S_in 167 may comprise suitable logic, circuitry, and/or code that may enable receiving data in accordance with the I2S interface.

The MS 162, the SPDIF block 163a, the HDMI block 163b, the arbitration block 166, and the I2S_in 167 may be shared for encoding and decoding path functions. The DAC_VC0 164a and the plurality of I2S output blocks 164b may be utilized for decoding path functions. The plurality of capture registers 165 may be utilized for encoding path functions.

The IOP 160 may receive at least one clock or reference signal from the PLL 124. In this regard, the PLL 124 may comprise suitable logic, circuitry, and/or code that enables generation of clock or reference signals for supporting a plurality of data rates, for example. The FCI arbiters 139,

147a, 147b, 157a, and 157b may comprise suitable logic, circuitry and/or code that may enable selection from at least one output signal that may result from an FM 104 stage for communication to another stage in the FM 104. The FCI arbiters may utilize a state-machine that enables a two-level of priority round robin approach, for example. The FCI mergers 138, 149a, 149b, and 159 may comprise suitable logic, circuitry, and/or code that may enable merging at least one output signal that may result from an FMM 104 stage for communication to another stage in the FMM 104.

In the exemplary embodiment of the invention disclosed in FIG. 1D, the FMM 104 may enable 24 playbacks via 48 channels, 24 FIFOs, and/or 48 ring buffers, of two channels for each playback. The FMM 104 may also enable 4 captures via 8 channels, 4 FIFOs and/or 8 ring buffers, of two channels per capture. The FMM 104 may also enable 8 outputs, that is, 16 channels, of stereo or multi-channel outputs. The outputs may comprise an SPDIF output for PCM or compressed audio, a DAC output for down-mixed stereo audio, at least two I2S outputs for 7.1 channels and for down-mixed stereo, and/or an HDMI output that may be shared with other output formats. The FMM 104 may also enable an I2S input that may be implemented within the IOP 160 instead of the BF0 130, for example, to enable the IOP 160 to handle the I2S input and I2S output clocks based on the PLL 124 since the BF0 130 may operate based on a system clock.

The FMM 104 disclosed in FIG. 1D may enable a multi-channel program that allows a channel group to be processed in the BF0 130, SRC0 140a, SRC1 140b, DP0 150a, DP1 150b, and/or the IOP 160. In this regard, each channel pair within a channel group may share a group identifier (ID). The channels in a group may be in a consecutive channel ID sequence. The group ID number may be the first channel pair ID or pipeline FIFO, for example. Arbiters associated with the pipeline buffer may treats the channel group as a single client, that is, a first client request to the arbiter may be handled when the remaining clients in the group also make a request. Once the request is granted, each channel pair may be processed in the same sequence as the channel pair ID sequence in a group. This approach may ensure channel synchronization across the FMM data path and may also simplify the mixing coefficient alignment.

The FMM 104 disclosed in FIG. 1D may also support the use of metadata information. The metadata may be part of secondary audio syntax that carries the dynamic mixing coefficients between the primary and secondary and the dynamic coefficients updating in mixing functions that may be required to align with the secondary audio frame boundary. The metadata message and frame information may be passed from the decode DSP 102 to the FMM 104 and then utilized to control mixing operations in the DP0 150a and/or the DP1 150b in order to relax timing requirements to achieve the alignment. In this regard, the FMM 104 may support metadata buffers, pre-formatted message, message unpackers, PCM tagging, and/or dual ping-pong coefficient banks in DP0 150a and/or the DP1 150b and the MI as control interface, for example.

The FMM 104 disclosed in FIG. 1D may enable a sample rate conversion pipeline block separate from the data path blocks to allow multiple sample rate conversion operations. In this regard, the sample rate conversion functions supported may comprise high quality SRC, that is, SRC with better than −120 dB noise suppression, for example, with ratios of 4 to 1, 1 to 4, 2 to 1, and/or 1 to 2. The sample rate conversion functions may also comprise loop back path to support serial SRC operations and/or linear interpolation of the ratio between 0 and 2, for example.

The FMM 104 may utilize a common internal interface (FCI) in various components to enable the components to be added or removed based on feature requirements without producing interface compatibility issues among the various FMM 104 components. The FCI may utilize a 24-bit data bus, for example, and a plurality of signals. The plurality of signals supported by the FCI may comprise a request (REQ) signal, an acknowledge (ACK) signal, a no acknowledge (NOACK) signal, an identification (ID) signal, a data (DATA) signal, a tag (TAG) signal, channel indicator (CH_LEFT0_RIGHT1) signal, for example.

The REQ signal may be an input signal that may be utilized for requesting a pair of left and right samples. In an exemplary embodiment of the invention, the REQ signal may be high on rising edge of system clock when there is a data request, and low when a second ACK signal is high or when a NOACK signal is high. Generally, the REQ signal may be responded with, for example, two consecutive ACK signal, the first may be a left channel sample and tag and the second may be a right channel sample and tag. When an output client of an FCI is not enabled, a NOACK signal may be outputted and a REQ signal may be de-activated. The ACK signal may be an output signal that may be utilized for acknowledging a requesting block. Each request may be responded with two ACK signals, for example. Each ACK signal may be one clock wide. The NOACK signal may be an output signal that may be utilized to indicate no acknowledgement when the current client is not enabled or when the request client ID is invalid, for example. A NOACK signal may terminate the request to a disabled block and prevents the state machine from hanging or from a dead lock.

The ID signal may be an input signal that may comprise a plurality of bits and that may correspond to identification of an output channel pair in a pipeline block. For example, the ID signal may be utilized to identify clients inside a block within the FMM 104 and/or to identify blocks within the FMM 104. The DATA signal may be an output signal that may comprise a plurality of bits, which may correspond to left or right channel samples. A portion of the DATA signal may be utilized for playback data, while another portion may be utilized for capture data since capture data may be PCM or compressed, where the compressed data may be 16 bits or 32 bits. The data in the DATA signal may be left channel sample when the CH_LEFT0_RIGHT1 signal is low and right channel sample when the CH_LEFT0_RIGHT1 signal is high. The DATA signal may be valid when the ACK signal is high on the rising edge of system clock, for example.

The TAG signal may be an output signal that may comprise a plurality of bits and that may correspond to left or right channel sample tags. The TAG signal may be a left channel sample tag when the CH_LEFT0_RIGHT1 signal is low and a right channel sample tag when the CH_LEFT0_RIGHT1 signal is high. The TAG signal may be valid when the ACK signal is high on the rising edge of system clock, for example. The CH_LEFT0_RIGHT1 signal may be an output signal that may be utilized to indicate left channel samples when it is low and right channel when it is high. The CH_LEFT0_RIGHT1 signal may be valid when the ACK signal is high on the rising edge of system clock, for example.

For some applications, such as for some Blu-ray specifications, metadata may be specified in the secondary audio which carries the dynamic coefficients for audio mixing between the primary and the secondary audio program. In this regard, the coefficients may require alignment with the secondary audio frame boundary during the mixing operation. Moreover, the coefficients in the metadata may be dynamically updated as often as every frame, for example.

Since the mixing operation between the primary and the secondary decoded PCM may be performed by the FMM 104 and there may not be frame information available either in decoded PCM or in existing mixing hardware, some data paths from the decode DSP 102 to the mixing hardware in the FMM 104 may be needed to carry both frame information and coefficients, for example. Moreover, since the coefficients utilized in the mixing operation may need to be updated in correct frame boundary at the appropriate time during mixing, a synchronization interface may be needed between FMM 104 mixing hardware and the decode DSP 102.

Figure 1E:
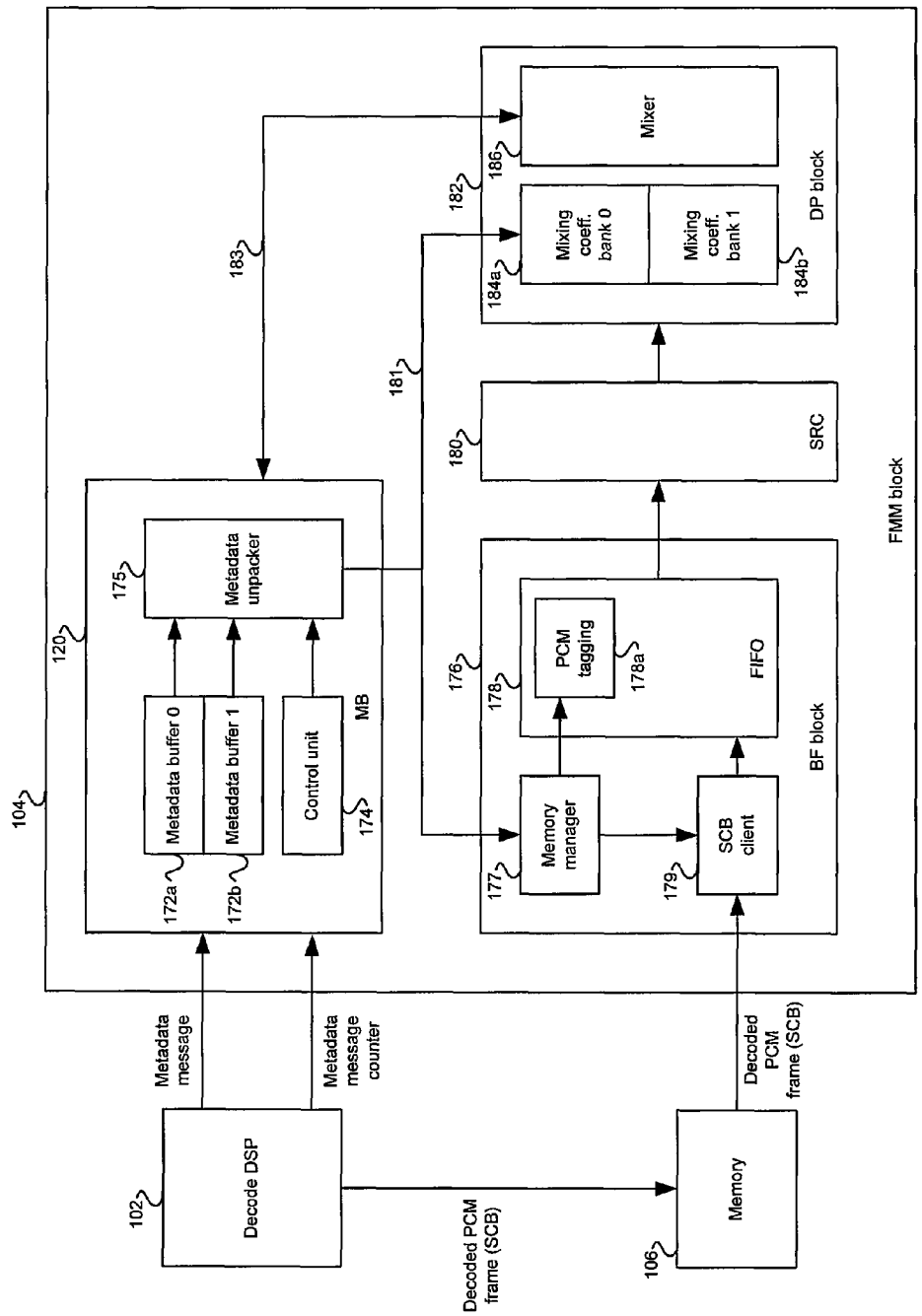
FIG. 1E is a block diagram illustrating exemplary metadata flow and operation between the decode DSP and the FMM block, in accordance with an embodiment of the invention.

FIG. 1E is a block diagram illustrating exemplary metadata flow and operation between the decode DSP and the FMM block, in accordance with an embodiment of the invention. Referring to FIG. 1E, there is shown the FMM 104, the decode DSP 102, and the memory 106 disclosed in FIG. 1A. The FMM 104 may comprise an MB block 120, a BF block 176, an SRC block 180, and a DP block 182. The MB block 120 may comprise a first metadata buffer (metadata buffer 0) 172*a*, a second metadata buffer (metadata buffer 1) 172*b*, a control unit 174, and a metadata unpacker 175. The BF block 176 may comprise a memory manager 177, a decoded PCM frame (SCB) client 179, and a FIFO 178. The FIFO 178 may comprise a PCM tagging block 178*a*. The DP block 182 may comprise a first mixing coefficients bank (mixing coeff. bank 0) 184*a*, a second mixing coefficients bank (mixing coeff. bank 1) 184*b*, and a mixer 186. At least a portion of the components disclosed in FIG. 1E may correspond to the FMM 104 components disclosed in FIG. 1D.

The decode DSP 102 may generate metadata messages that may be communicated to the MB block 120 and/or decoded PCM frames that may be communicated to the BF block 176 via the memory 106, for example. The metadata buffers 172*a* and 172*b* may comprise suitable logic, circuitry, and/or code that may enable storage of metadata messages from the decode DSP 102 via a bus. The control unit 174 may comprise suitable logic, circuitry, and/or code that may enable processing of a metadata message counter from the decode DSP 102 via a bus. The metadata unpacker 175 may comprise suitable logic, circuitry, and/or code that may enable generation of mixing coefficient information and/or a start of frame indicator from the information generated and/or stored in the metadata buffers 172*a* and 172*b* and the control unit 174. There may be more than one metadata unpacker 175 to enable more than one data stream or path, for example. The metadata unpacker 175 may communicate, via the signal 181, for example, a frame start indication to the BF block 176 and the mixing coefficient information to the DP block 182. The MB block 120 may also enable selection of the mixing coefficients bank 184*a* or the mixing coefficients bank 184*b* via the signal 183, for example.

The memory manager 177 may comprise suitable logic, circuitry, and/or code that may enable management of memory addresses. In this regard, the memory manager 177 may utilize the frame start indicator provided by the metadata unpacker 175. The SCB client 179 may comprise suitable logic, circuitry, and/or code that may enable receiving decoded PCM frame information from the memory 106. The SCB client 179 may also receive information from the memory manager 177 for processing the received decoded PCM frame. The FIFO 178 may comprise suitable logic, circuitry, and/or code that may enable first-in first-out storage of processed decoded PCM frame information. The PCM tagging 178 may comprise suitable logic, circuitry, and/or code that may enable tagging the start of a processed decoded PCM frame in the FIFO 178. In this regard, the PCM tagging 178*a* may utilize at least one signal indicating start of frame information provided by the memory manager 177, for example.

The SRC block 180 may comprise suitable logic, circuitry, and/or code that may enable sample rate conversion of the processed decoded PCM frame from the BF block 176. For example, the SRC block 180 may up-convert or increase the number of samples at, for example, the rate of 1:4 or 1:2. Alternatively, the SRC block 180 may down-convert or decrease the number of samples at, for example, the ratio 4:1 or 2:1. The SRC block 180 may also convert the number of samples by a non-integer conversion ratio such as, 1.1:2, by linear interpolation. The SRC block 180 may be capable of converting the sample rate of more than one channel simultaneously. For example, one channel may be up-converted while another may be down-converted.

The mixing coefficient banks 184*a* and 184*b* may comprise suitable logic, circuitry, and/or code that may enable storage of mixing coefficients communicated from the MB block 120 via the signal 181. The mixer 186 may comprise suitable logic, circuitry, and/or code that may enable selection of a set of mixing coefficients from the mixing coefficient banks 184*a* and 184*b* for mixing the sample rate converted PCM frame from the SRC block 180.

In operation, the metadata and the frame information may be passed and stored into buffers in the MB block 120 when the secondary audio program is decoded in the decode DSP 102. Moreover, both coefficients and frame information may be communicated to the BF block 176 and the DP block 182 configuration registers at the appropriate time to achieve the alignment of mixing coefficient with frame boundary. A relaxed timing control may be achieved simply by a message counter as an interface between the metadata unpacker 175 and the decode DSP 102, a message index between the metadata unpacker 175 and the DP block 182 with ping-pong coefficient banks 184*a* and 184*b*.

In this regard, the metadata buffers 172*a* and 172*b* may store preformatted messages from the decode DSP 102 written through a bus when a secondary audio frame is decoded. Since there are two data flows of decode and encode path in the FMM 104, two metadata buffers may be implemented to allow two streams of metadata messages to be passed from the decode DSP 102 to the FMM 104 in parallel. The metadata unpacker 175 may enable processing and passing of the message to various FMM 104 configuration registers in non-restrictive timing. There may be an 8-bit message counter in the metadata block 120, for example. When a new message is stored in a metadata buffer by the decode DSP 102, the counter may be incremented by the decode DSP 102. The counter may be decremented when a message is processed and sent to the BF block 176 and/or to the DP block 182 by the metadata unpacker 175. The metadata unpacker 175 may start to process a message when the message counter is larger than 0 and an input control signal from the DP block 182 meets a predetermined set of conditions. In some instances, two metadata unpackers 175 may be implemented for two streams of metadata messages, for example.

The coefficients in one mixing coefficient bank in the DP block 182 may be updated from the metadata block 120 while the other bank coefficients is being read for mixing operations.

A metadata message may comprise a frame start address (frame_start_address) signal of decoded PCM frame in ring buffer, a metadata index (MI), a valid bit, and/or mixing coefficients for both primary and secondary audio, for example. The metadata index may comprise multiple bits, for example. The metadata unpacker 175 may communicate the frame_start_address, the MI, and the valid bit to BF block 176 and the mixing coefficients to the DP block 182 via the signal 181, for example.

An 8-bit tag per PCM sample may be associated with each 24-bit PCM to carry the side information from the BF block 176, the SRC block 180, the DP block 182, and/or an input-output block (IOP), such as the IOP 160 in FIG. 1D, to enable these blocks to utilize the side information when each PCM is received and processed. The side information may comprise a PCM valid bit, a PCM inserted bit, and the metadata index. The 4-bit MI may be directly copied from a metadata message and may be incremented by the decode DSP 102 to follow the message sequence. When a new frame_start_address and a newly incremented MI are loaded into the BF block 176 configuration registers, the valid bit may be set to 1 in the message by the decode DSP 102. The frame_start_address may be utilized by the BF block 102 to identify the first PCM sample in the received frame and the newly incremented MI may be placed in the 8-bit PCM tag for the PCM samples of the frame. The MI in the PCM tag may be received later by the DP block 182 for mixing between the primary and the secondary audio. In some instances, the least significant bit of the MI may be utilized by the DP block 182 to select one of the two mixing coefficient banks for the mixing operations.

The MI in the PCM tag received by the DP block 182 may also be outputted back to the metadata unpacker 175. The MI in the PCM tag may be utilized by the metadata unpacker 175 along with the message counter as a control interface to determine when the next metadata message may need processing and may need to be sent to the BF block 176 and/or the DP block 182. The MI may indicate to the metadata unpacker 175 the last message received by the BF block 176 and the DP block 182 and which mixing coefficient bank the DP block 182 may be accessing. When the message counter is larger than zero, for example, and the MI in next message in the metadata buffer is the index from the DP block 182 plus 1, then the next message in the buffer may be processed and communicated. There may be two MI interfaces between the DP block 182 and each of the metadata unpackers 175 to allow two metadata message streams.

Figure 1F:
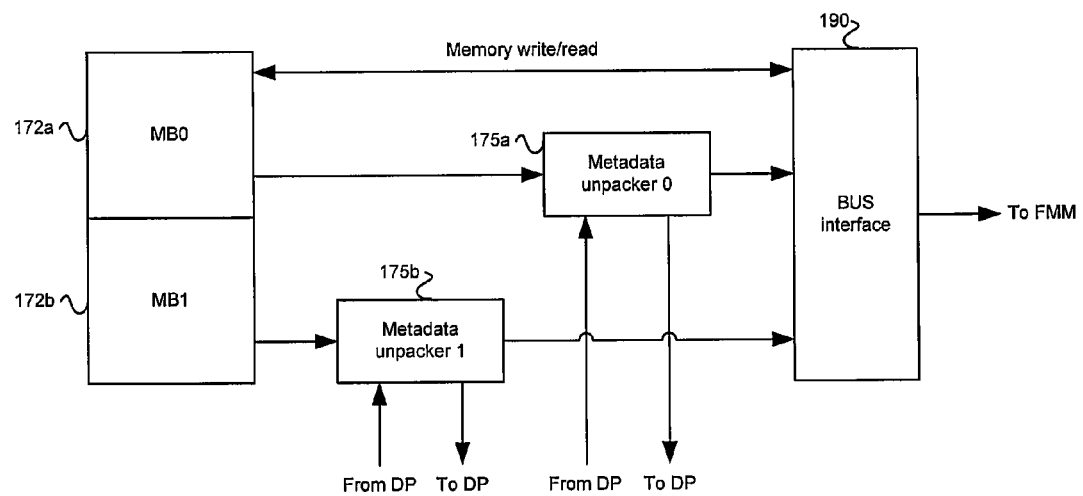
FIG. 1F is a block diagram illustrating an exemplary metadata block architecture, in accordance with an embodiment of the invention.

FIG. 1F is a block diagram illustrating an exemplary metadata block architecture, in accordance with an embodiment of the invention. Referring to FIG. 1F, there is shown a portion of the metadata block 120 that may comprise the first metadata buffer (metadata buffer 0) 172a, the second metadata buffer (metadata buffer 1) 172b, a first metadata unpacker (metadata unpacker 0) 175a, a second metadata unpacker (metadata unpacker 1) 175b, and a BUS interface 190. The metadata unpackers 175a and 175b may be similar or substantially the same as the metadata unpacker 175 disclosed in FIG. 1E. The BUS interface 190 may comprise suitable logic, circuitry, and/or code that may enable communication between the MB block 120 and at least one component of the FMM block 104, for example. In this regard, the BUS interface 190 may communicate with the BF block 176, the SRC block 180, and/or the DP block 182.

One of the metadata buffers 172a and 172b may be utilized for audio mixing in playback path and the other metadata buffer for encode path, however, a metadata buffer need not be limited to just playback path or encode path operations. In one instance, when both encode and decode paths are enabled, the decode DSP 102 may store the same message to both metadata buffers and may control both message counters. The decode DSP 102 may store one message to one of the metadata buffers 172a and 172b and may control two message counters and two address sets in one of the buffer. In another instance, the two independent message streams may flow through the two metadata buffers 172a and 172b and the two metadata unpackers 175a and 175b in the MB block 120, and the two flows may be utilized to control two independent groups of mixers. The metadata buffers 172a and 172b may be implemented in a single port RAM, for example. Each entry in a metadata buffer may be addressed in the RBUS address range.

There may be one or more hardware configuration registers in each of the metadata unpackers 175a and 175b. The MB block 120 may be configured to perform a plurality of operations. For example, when an MB enable signal is zero, the corresponding metadata unpacker may be reset, and an appropriate metadata message counter signal and other internal states may also be reset to zero. In another instance, either a host processor, such as the processor 100, or the decode DSP 102 may configure the MB block 120 address registers. In this regard, the appropriate metadata unpacker may be enabled based on a mixer select signal that indicates the last mixer in the DP block 182 to utilize the metadata unpacker.

When the decode DSP 102 receives and decodes new metadata from the secondary audio program and generates a new metadata message, the decode DSP 102 may write a new metadata message into a metadata buffer in the MB block 120. The decode DSP 102 may also update the metadata buffer write address and may increment a metadata message counter. The message counter may be decremented after one block of metadata is processed by the metadata unpackers 175a and/or 175b.

When the metadata unpackers 175a and/or 175b are enabled, the metadata unpackers may detect that there are new metadata messages in the metadata buffer when the metadata message counter is non-zero. The metadata unpackers 175a and/or 175b may decode the metadata MI and the block length in the message header. In this regard, when the message is the first message since a reset, the metadata unpackers 175a and/or 175b may process the metadata message as soon as possible. When it is not the first message since a reset, the metadata unpackers 175a and/or 175b may compare the MI in the new message in the buffer with the MI from the mixer. When the MI in the metadata buffer is equal to the MI in the mixer plus 1, the metadata unpacker may write each register content in the message to the bus address to both the FB block 176 and the DP block 182. After the entries in the message are processed, the metadata unpacker may decrement the metadata message counter in the configuration register.

When the MI in the metadata buffer is equal to the MI in the mixer plus 2, the metadata unpacker may wait until the MI in the mixer increments to process the message as soon as possible. This may indicate that the previous message has not been used by the BF block 176 and the DP block 182 yet, and the next message will be waited until MI in the metadata buffer is equal to the MI in the mixer plus 1. When the MI in the metadata buffer is equal to the MI in the mixer or is larger than the MI in the mixer plus 2, the next message is not in the right sequence and an error signal may be generated by the metadata unpacker. In this regard, the metadata unpacker may wait until the decode DSP 102 may generate a reset signal.

Since the metadata buffer may be implemented utilizing in a single port RAM, for example, external RBUS write or read from the decode DSP 102 or the host processor may have a higher priority than an internal read. The messages may be updated up to once per frame, for example. The message processing rate may be limited by the time it takes a pair of samples to go from the ring buffer to the mixer output. If the message input rate is higher than may be processed by the FMM block 104, a metadata buffer overflow condition may occur.

Figure 2:
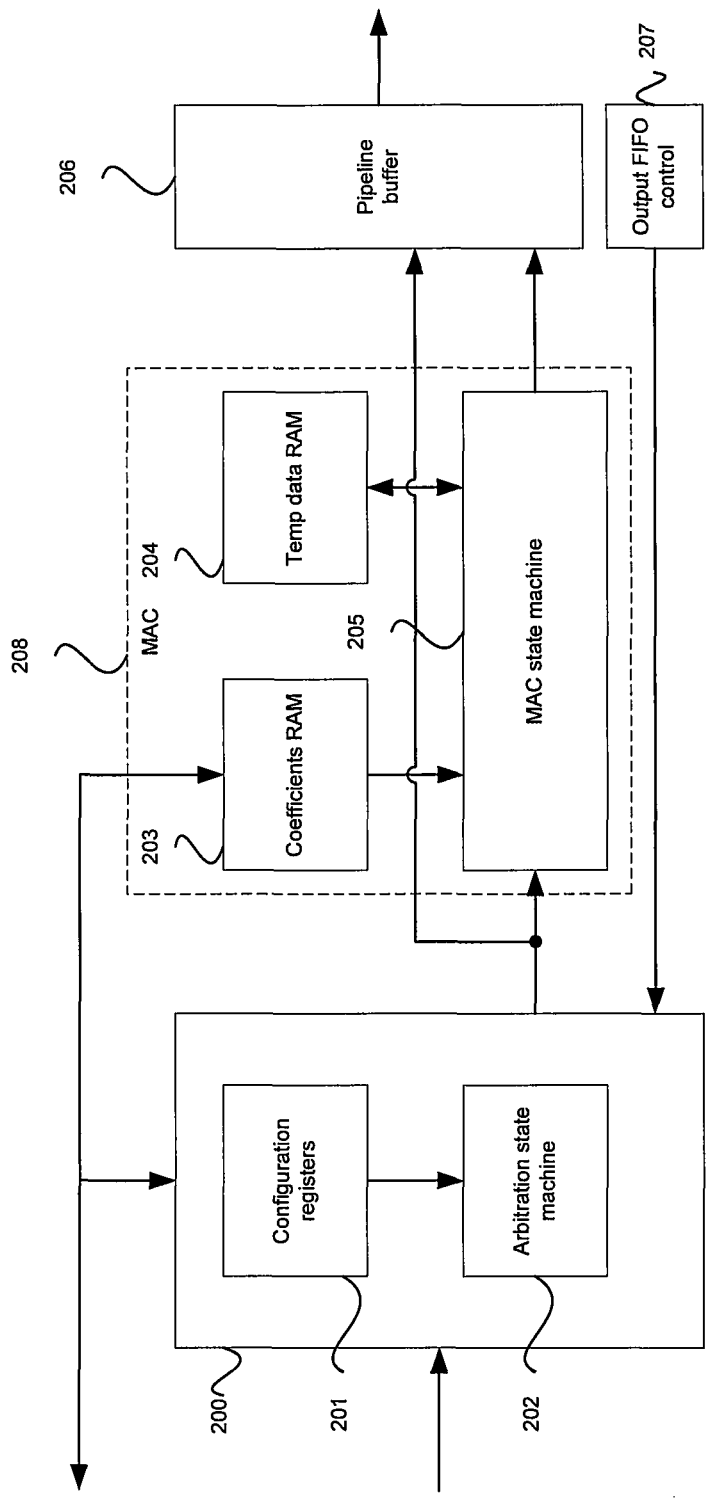
FIG. 2 is a block diagram of an exemplary system for performing sample rate conversion on a plurality of channels, in accordance with an embodiment of the invention.

FIG. 2 is a block diagram of an exemplary system for performing sample rate conversion on a plurality of audio channels, in accordance with an embodiment of the invention. Referring to FIG. 2, there is shown an input control arbitration unit 200, configuration registers 201, an arbitration state machine 202, a portion of RAM for storing coefficients 203, a multiply/accumulate (MAC) block 208, a portion of RAM for storing temporary data 204, a MAC state machine 205, a pipeline buffer 206, and an output FIFO control block 207.

The inputs to the SRC are selected from either 24 channel pairs from the BF 130 (FIG. 1D), 24 channel pairs from either SRC0 140a (FIG. 1D) or SRC1 140b (FIG. 1D), or 16 channel pairs from either DP0 150a (FIG. 1D) or DP1 150b (FIG. 1D). The SRC may increase or decrease the effective sample rate of the audio input samples by either up-conversion or down-conversion. For example, the SRC may up-convert or increase the number of samples at, for example, the rate of 1:4 or 1:2. Alternatively, the SRC may down-convert or decrease the number of samples at, for example, the ratio 4:1 or 2:1. The SRC may also convert the number of samples by a non-integer conversion ratio such as, 1.1:2, by linear interpolation. The output of the SRC may be a continuous stream of audio samples. The audio stream may be ramped-up initially so as to produce a gradual increase in the volume, which may be more pleasing to an end user. The audio stream may also be ramped-down prior to being disabled for the same reasons. The output of the SRC may go to SRC0 140a, SRC1 140b, DP0 150a or DP1 150b.

The configuration registers 201 may comprise suitable logic, circuitry and/or code that may enable storing the configuration for the various channels. In this regard, the configuration registers 201 may store a variety of configuration settings for each channel. These settings may include, for example, a channel pair enable setting for enabling and disabling channels. These setting may also include a priority setting so that certain channels may be given higher priority than others. In this regard, if two channels require processing at the same time, the channel with the higher priority may be processed first. The configuration registers may also include settings for specifying the conversion ratio for any given channel. For example, the SRC may be configured to up-convert one channel at, for example, a 1:4 rate and also be configured to down-convert another channel at, for example, a rate of 2:1.

The arbitration state machine 202 may comprise suitable logic, circuitry and/or code that may enable selecting one of a plurality of inputs for subsequent processing. In this regard, the arbitration unit may arbitrate between a plurality of requests communicated from, for example, a plurality of FIFOs within the pipeline buffer 206 via the output FIFO control block 207. A FIFO may, for example, make a request when enough space is available within the FIFO for one more pair of samples. The arbitration unit may then select the channel associated with the FIFO making the request.

The arbitration state machine 202 may utilize a round-robin technique to check whether a request may be pending for one of the plurality of FIFOs. In this regard, the arbitration state machine may divide the FIFOs into, for example, high and low priority groups. A high priority FIFO may be processed first. Alternatively, when there is, for example, one high priority client and number of low priority client requests, it may be optional to allow arbitration alternating between high and low priority clients so that low priority clients may be processed even though high priority client requests may be pending.

The arbitration state machine 202 may operate in parallel with the MAC 208. The arbitration unit may process the next FIFO request while the MAC 208 continues to process the current FIFO request. In this way, the total cycles available for the signal processing may not be effected by the processing cycles of arbitration state machine 202.

The multiply/accumulate (MAC) block 208 may comprise suitable logic, circuitry, and/or code that may enable up-converting and down-converting the sample rate of data input into the SRC. The MAC 208 may, for example, have the characteristics of a finite-impulse-response filter (FIR) with a plurality of taps. The MAC could have other characteristics such as an infinite-impulse-response (IIR) filter, for example. The number of taps and the value of the tap coefficients may vary depending on the type of conversion required. For example, the FIR filter for a high quality 4:1 conversion may correspond to the following formula:

$$Y(n) = \sum_{i=0}^{127} (X(n-i) + X(n-255+i)) * HQ\_Coef(i)$$

$$X(n:(n-255)) = X((n+4):(n-251))$$

where n is the sample number, i is a tap in the FIR filter, X(n:(n−255)) are the input samples for the calculation, Y(n) is the output sample, and HQ_Coef(0:127) are the tap coefficients. The FIR filter for a high quality 1:4 conversion may correspond to the following formula:

$$Y(4*n+l) = 4 * \sum_{i=0}^{31} X(n-i) * HQ\_Coef(4*i+l) +$$

$$4 * \sum_{i=0}^{31} X(n-32-i) * HQ\_Coef(127-(4*i+l))$$

$$X(n:(n-63)) = X((n+1):(n-62))$$

where n is the sample number, i is a tap in the FIR filter, X(n:(n−63)) are the input samples for the calculation, Y(4*n+ 1) is the output sample, HQ_Coef(0:127) are the tap coefficients, and I=3.

The pipeline buffer 206 may comprise suitable logic, circuitry and/or code that may enable buffering a plurality of audio streams. The pipeline buffer may be comprised of a plurality of FIFOs, one for each audio stream. In this regard, each FIFO may be comprised of memory for storing samples. In addition, each FIFO may comprise a watermark, for example, a full and empty watermark, that that may enable determining the number of samples in the FIFO. The output FIFO control 207 may comprise suitable logic, circuitry and/ or code that may enable determining whether the number of samples in a FIFO fall below the empty watermark, for example. When this happens, the output FIFO control may generate a request for more audio sample to the input control arbitration unit 200.

In operation, a processor 100, may configure the configuration registers 201 within the input control arbitration unit 200 to enable several audio streams to be processed by the SRC. For example, a first audio stream may need to be un-converted at a rate, for example, of 1:4. A second audio stream may need to be down-converted at a rate, for example, of 4:1. Yet a third audio stream may need to be up-converted at a rate, for example, of 1.2:4. The processor may store these configuration settings in the configuration register 201. It may also store settings indicating the relative priorities of the three audio streams.

A FIFO within the pipeline buffer 206 may also be dedicated to each of the streams. Initially, all three FIFOs may be empty, in which case the output FIFO control 207 may generate a request for audio samples for all three FIFOs. The arbitration state machine 200 may then determine which of the request has the highest priority. It may then route audio samples from the input of the input control arbitration unit 200 to the MAC 208 where the conversion may take place. The MAC may be configured to perform the conversion associated with the first stream to be processed and may output the converted samples to the appropriate FIFO within the pipeline buffer 206. Once that FIFO is, for example, full, the arbitration state machine 200 may route audio samples corresponding to a second audio stream to the MAC. In this case the MAC 208 may then be reconfigured to perform the conversion associated with the second audio stream and may output the converted samples to a FIFO in the pipeline buffer corresponding to the second audio stream.

Figure 3:
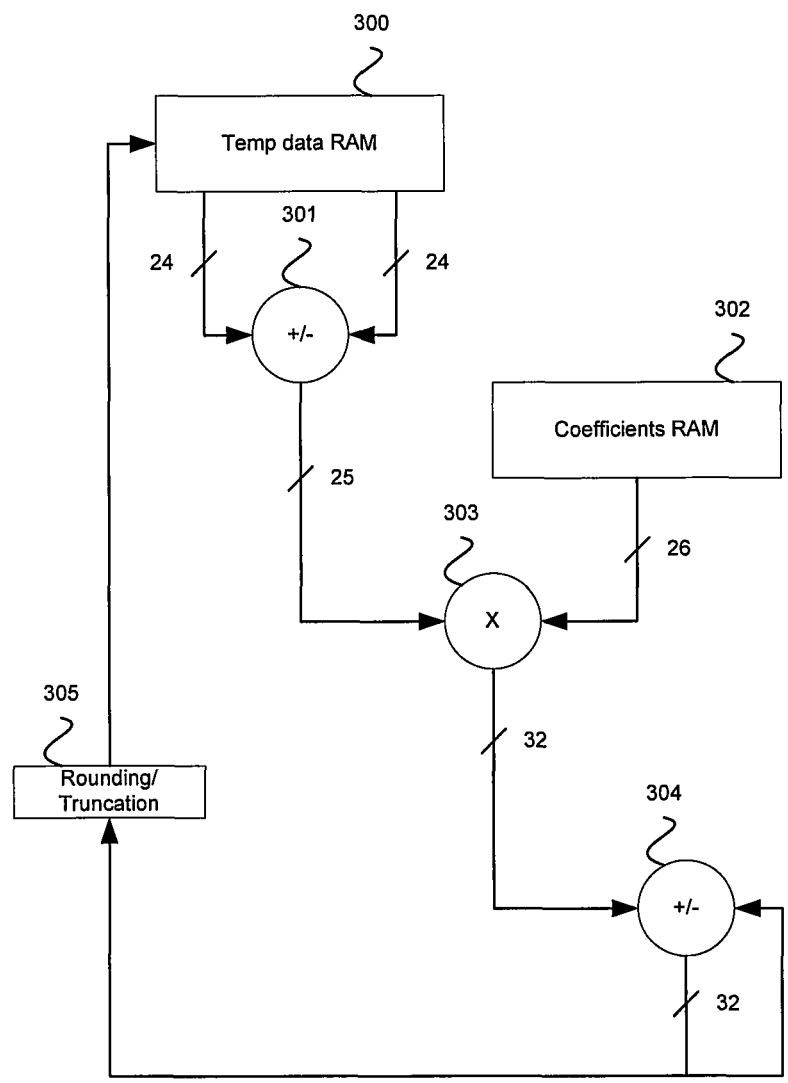
FIG. 3 is a block diagram of an exemplary system for performing a MAC function, in accordance with an embodiment of the invention.

FIG. 3 is a block diagram of an exemplary system for performing a MAC function, in accordance with an embodiment of the invention. Referring to FIG. 3, there is shown a portion of RAM for storing temporary data 300, a portion of RAM for storing coefficients 302, a multiplier 303, a first and second accumulator 301 and 304, and a rounding/truncation block 305.

The portion of RAM for storing temporary data 300 may comprise suitable logic, circuitry and/or code that may enable storing a plurality of samples associated with a channel. In this regard, storing samples from the various channels may enable the SRC to at least conceptually process multiple channels in parallel. For example, a high priority channel may interrupt the processing for a low priority 4:1 down-conversion on a given channel. Samples currently being processed in the MAC may be temporally stored in the portion of RAM for storing temporary data 300, and data associated with the high priority channel may be retrieved from the portion of RAM for storing temporary data 300. This may enable the MAC 208 to continue processing the high priority channel from where it left off. That is, the samples retrieved may be those samples the MAC may have been processing just before the MAC 208 may have been interrupted. In this way, there may be a plurality of virtual channels being processed simultaneously by the MAC.

The portion of RAM for storing coefficients 302 may comprise suitable logic, circuitry and/or code that may enable storing the coefficients corresponding to the various taps for a given FIR function. In this regard, it may only be necessary to store half the coefficients needed for a given conversion ratio to memory. This may be realized because the FIR tap weights within the FIR may be symmetrical. For example, a high quality 4:1 down-conversion FIR filter may require 256 taps and therefore 256 coefficients. But only 128 of the 256 taps may be unique. A high quality 1:4 conversion FIR filter may require 128 taps and therefore 128 coefficients. But only 64 of the 128 taps may be unique. Therefore, the amount of space required in the portion of RAM for storing coefficients may effectively be reduced by taking advantage of the FIR tap weight symmetry. The portion of RAM for storing coefficients 302 may reside in a memory 106, accessible by the processor 100.

In operation, 24-bit audio samples may be input into the temp data RAM 300. Various audio samples from the temp data RAM 300 may be added together by a first accumulator 301. A 25-bit result from the first accumulator 301 and a coefficient corresponding to a particular tap weight of an FIR filter may be multiplied together by the multiplier 303. A 32-bit result from the multiplier may then be added to a previous sample by the second accumulator 304. A 32-bit result from the second accumulator 304 may be input back into the second accumulator 304 and also input into a rounding/truncation block 305. The output of the rounding/truncation block 305 may be stored back into the temp data RAM 300.

This process may have to be repeated a number of times for the various conversion rates. For example, in performing the 4:1 high quality conversion described above, 128 iterations per output sample may be necessary. In performing the 1:4 high quality conversion described above, 64 iterations per output sample may be necessary. After the process has completed, the MAC may output the output samples to the pipeline buffer 206

Figure 4:
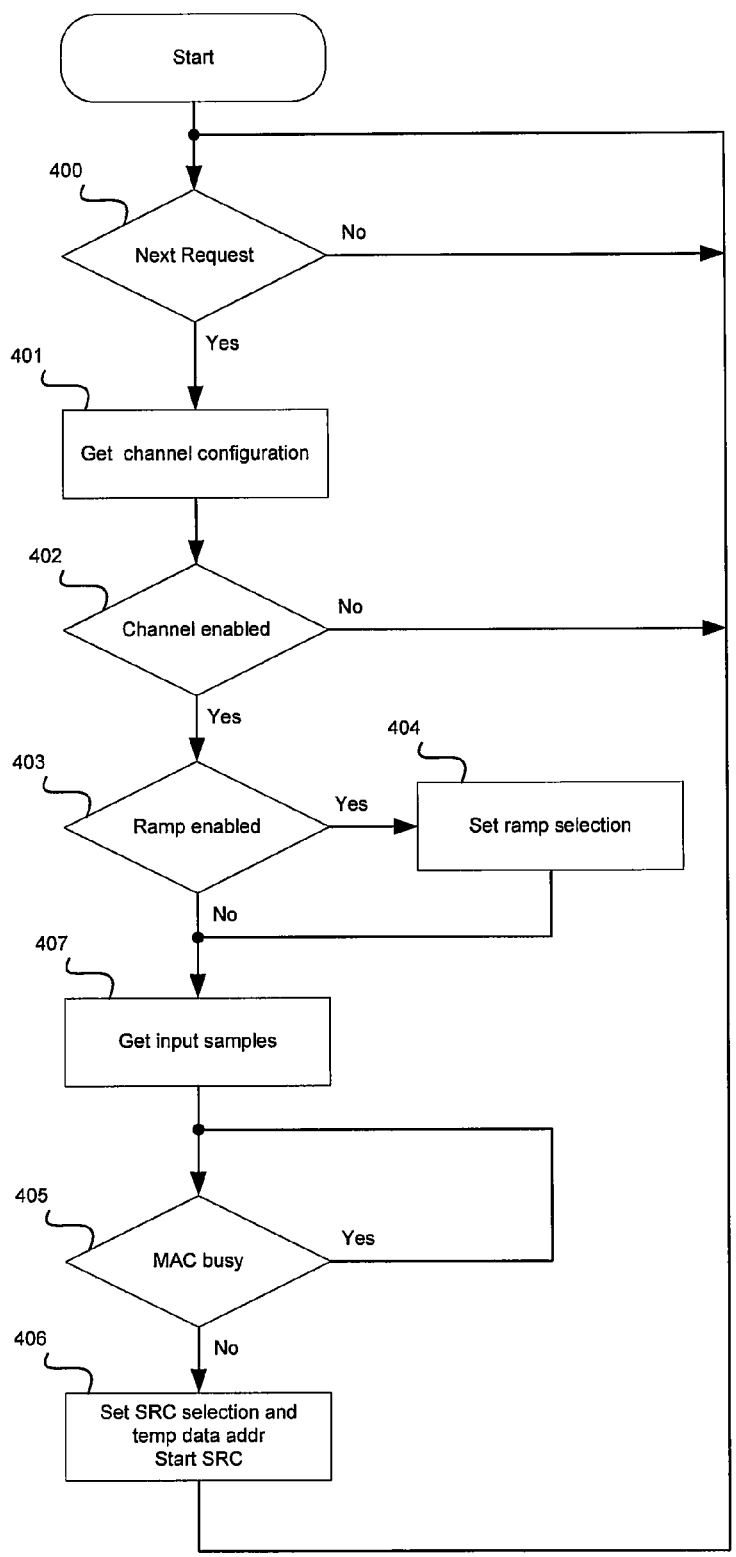
FIG. 4 is a block diagram of an exemplary flow diagram for performing sample rate conversion on a plurality of channels, in accordance with an embodiment of the invention.

FIG. 4 is a block diagram of an exemplary flow diagram for performing sample rate conversion on a plurality of channels, in accordance with an embodiment of the invention. In step 400, the arbitration state machine 202 (FIG. 2) may wait until, for example, a request from the output FIFO control block 207 is received. This request may occur, for example, when the number of samples in a FIFO within the pipeline buffer 206 falls below a threshold. For example, the request may occur when the number of samples in the FIFO falls below 10 samples.

At step 401, the arbitration state machine 202 may read the registers within the configuration registers 201 associated with the channel to determine whether the channel is, for example, enabled. If the channel is not enabled, no further possessing may be done on that channel and step 400 may be repeated.

At step 403, the configuration registers 201 may be read to determine whether ramping-up of the channel is, for example, enabled. If the ramping is enabled, then at step 404 the input control arbitration unit 200 may be configured so that the volume of the channel is, for example, gradually increased. This may be done to avoid sudden pops that may otherwise occur if the channel was, for example, instantly turned on.

At step 407, the input samples associated with the channel may be selected by the input arbitration state machine 202 so that they may be processed by the MAC 208. At step 405, the input arbitration state machine 202 may wait to transfer samples to the MAC 208 until the MAC 208 is, for example, finished processing samples associated with the previously requested channel. At step 406, the MAC 208 may be ready to process the input samples associated with the pending channels. In this case, the MAC 208 may first store samples associated with the channel currently being processed to the portion of RAM for storing temporary data 204. The MAC 208 may then retrieve coefficients associated with the pending channel from the portion of RAM for storing coefficients 203 and may also retrieve samples associated with the pending channel from the portion of RAM for storing temporary data 204. This may enable the MAC 208 to perform an FIR function and this may in turn enable up-conversion and down-conversion of the data rate of the input samples. In this manner, the MAC may be dynamically reconfigured to process channels with varying requirements. For example, some channels may require up-conversion and some may require down-conversion. Furthermore, the up-conversion rates among various channels may be different. For example, one channel may be up-converted at a rate of 1:2, while another may be up-converted at a rate of 1:4.

Another embodiment of the invention may provide a method for performing the steps as described herein for performing sample rate conversion. For example, the system shown in FIG. 2 may be configured to convert the sample rate of a first audio channel of a plurality of audio channels to produce a first audio stream of samples; and may be dynamically reconfiguring to convert the sample rate of a second audio channel of said plurality of audio channels to produce a second audio stream of samples. Both audio streams may be output from the system shown in FIG. 2 at the same time. The system may ramp up and ramp down the respective audio streams. The system may also comprise configuration registers 201 for storing settings associated with the audio channels including a priority setting. The system may utilize an arbitration state machine 202 to arbitrate between requests for additional data for the two audio streams and may suspend processing of one channel if the request is made by a channel with a higher priority. When this happens, the system may store samples associated with the suspended channel to a memory 204 and may retrieve tap weight coefficients corresponding to the desired sample rate for the higher priority channel from a memory 203 as well. A plurality of FIFOs within a pipeline buffer 206 may be utilized to enable outputting various audio streams corresponding to various channels at the same time.

Accordingly, the present invention may be realized in hardware, software; or a combination of hardware and software. The present invention may be realized in a centralized fashion in at least one computer system, or in a distributed fashion where different elements are spread across several interconnected computer systems. Any kind of computer system or other apparatus adapted for carrying out the methods described herein is suited. A typical combination of hardware and software may be a general-purpose computer system with a computer program that, when being loaded and executed, controls the computer system such that it carries out the methods described herein.

The present invention may also be embedded in a computer program product, which comprises all the features enabling the implementation of the methods described herein, and which when loaded in a computer system is able to carry out these methods. Computer program in the present context means any expression, in any language, code or notation, of a set of instructions intended to cause a system having an information processing capability to perform a particular function either directly or after either or both of the following: a) conversion to another language, code or notation; b) reproduction in a different material form.

While the present invention has been described with reference to certain embodiments, it will be understood by those skilled in the art that various changes may be made and equivalents may be substituted without departing from the scope of the present invention. In addition, many modifications may be made to adapt a particular situation or material to the teachings of the present invention without departing from its scope. Therefore, it is intended that the present invention not be limited to the particular embodiment disclosed, but that the present invention will include all embodiments falling within the scope of the appended claims.

What is claimed is:

1. A method for processing signals, the method comprising:
    configuring a system to convert a sample rate of a first audio channel of a plurality of audio channels to produce a first audio stream of samples; and
    dynamically reconfiguring said system to convert a sample rate of a second audio channel of said plurality of audio channels to produce a second audio stream of samples, said reconfiguring comprising suspending sample rate conversion of one of said first and said second audio channels based on a priority setting of one or both of said first and said second audio channels and storing samples associated with the suspended one of said first and said second audio channels to a memory for later processing after sample rate conversion of the one of said first and said second audio channels is restored, and wherein said first and second audio streams are output from said system at the same time.

2. The method according to claim 1, comprising ramping up said first audio stream.

3. The method according to claim 1, comprising ramping down said first audio stream.

4. The method according to claim 1, comprising configuring one or more registers to store settings associated with each of said plurality of audio channels.

5. The method according to claim 4, wherein said settings comprise priority settings.

6. The method according to claim 1, comprising arbitrating between request for additional data from said first and second audio stream of samples.

7. The method according to claim 6, comprising suspending processing of a first channel when said request corresponds to a second channel that is of higher priority.

8. The method according to claim 7, comprising retrieving a plurality of tap weight coefficients corresponding to a sample rate conversion for said second channel from a memory.

9. The method according to claim 1, comprising processing each of said plurality of channels using at least one FIFO.

10. A machine-readable storage having stored thereon, a computer program having at least one code section for processing signals, the at least one code section being executable by a machine for causing the machine to perform steps comprising:
    configuring a system to convert a sample rate of a first audio channel of a plurality of audio channels to produce a first audio stream of samples; and
    dynamically reconfiguring said system to convert a sample rate of a second audio channel of said plurality of audio channels to produce a second audio stream of samples, wherein said reconfiguring comprising suspending sample rate conversion of one of said first and said second audio channels based on a priority setting of one or both of said first and said second audio channels and storing samples associated with the suspended one of said first and said second audio channels to a memory for later processing after sample rate conversion of the one of said first and said second audio channels is restored, and wherein said first and second audio streams are output from said system at the same time.

11. The machine-readable storage according to claim 10, wherein said at least one code section comprises code that enables ramping up said first audio stream.

12. The machine-readable storage according to claim 10, wherein said at least one code section comprises code that enables ramping down said first audio stream.

13. The machine-readable storage according to claim 10, wherein said at least one code section comprises code that enables configuring one or more registers to store settings associated with each of said plurality of audio channels.

14. The machine-readable storage according to claim 13, wherein said settings comprise priority settings.

15. The machine-readable storage according to claim 10, wherein said at least one code section comprises code that enables arbitrating between request for additional data from said first and second audio stream of samples.

16. The machine-readable storage according to claim 15, wherein said at least one code section comprises code that enables suspending processing of a first channel when said request corresponds to a second channel that is of higher priority.

17. The machine-readable storage according to claim 16, wherein said at least one code section comprises code that enables retrieving a plurality of tap weight coefficients corresponding to a sample rate conversion for said second channel from a memory.

18. The machine-readable storage according to claim 10, wherein said at least one code section comprises code that enables processing each of said plurality of channels using at least one FIFO.

19. A system for processing signals, the system comprising:
   one or more circuits that enables configuring a system to convert a sample rate of a first audio channel of a plurality of audio channels to produce a first audio stream of samples; and
   said one or more circuits enables dynamically reconfiguring said system to convert a sample rate of a second audio channel of said plurality of audio channels to produce a second audio stream of samples, wherein said reconfiguring comprising suspending sample rate conversion of one of said first and said second audio channels based on a priority setting of one or both of said first and said second audio channels and storing samples associated with the suspended one of said first and said second audio channels to a memory for later processing after sample rate conversion of the one of said first and said second audio channels is restored, and wherein said first and second audio streams are output from said system at the same time.

20. The system according to claim 19, wherein said one or more circuits enables ramping up said first audio stream.

21. The system according to claim 19, wherein said one or more circuits enables ramping down said first audio stream.

22. The system according to claim 19, wherein said one or more circuits enables configuring one or more registers to store settings associated with each of said plurality of audio channels.

23. The system according to claim 22, wherein said settings comprise priority settings.

24. The system according to claim 19, wherein said one or more circuits enables arbitrating between request for additional data from said first and second audio stream of samples.

25. The system according to claim 24, wherein said one or more circuits enables suspending processing of a first channel when said request corresponds to a second channel that is of higher priority.

26. The system according to claim 25, wherein said one or more circuits enables retrieving a plurality of tap weight coefficients corresponding to a sample rate conversion for said second channel from a memory.

27. The system according to claim 19, wherein said one or more circuits enables processing each of said plurality of channels using at least one FIFO.

* * * * *